US012299290B2

(12) United States Patent
Sirocka

(10) Patent No.: US 12,299,290 B2
(45) Date of Patent: May 13, 2025

(54) HEADROOM MANAGEMENT DURING PARALLEL PLANE ACCESS IN A MULTI-PLANE MEMORY DEVICE

(71) Applicant: Micron Technology, Inc., Boise, ID (US)

(72) Inventor: Nathan Joseph Sirocka, Loomis, CA (US)

(73) Assignee: Micron Technology, Inc., Boise, ID (US)

( * ) Notice: Subject to any disclaimer, the term of this patent is extended or adjusted under 35 U.S.C. 154(b) by 155 days.

(21) Appl. No.: 17/886,364

(22) Filed: Aug. 11, 2022

(65) Prior Publication Data

US 2023/0105208 A1 Apr. 6, 2023

Related U.S. Application Data

(60) Provisional application No. 63/262,053, filed on Oct. 4, 2021.

(51) Int. Cl.
*G06F 1/26* (2006.01)
*G06F 3/06* (2006.01)

(52) U.S. Cl.
CPC .......... *G06F 3/0616* (2013.01); *G06F 3/0629* (2013.01); *G06F 3/0679* (2013.01)

(58) Field of Classification Search
CPC ..... G06F 3/0616; G06F 3/0629; G06F 3/0679
See application file for complete search history.

(56) References Cited

U.S. PATENT DOCUMENTS

| | | | |
|---|---|---|---|
| 2018/0089078 A1* | 3/2018 | Ohno | G11C 16/10 |
| 2019/0179392 A1* | 6/2019 | Patel | G06F 1/3275 |
| 2020/0254946 A1* | 8/2020 | Ono | G06F 1/266 |
| 2021/0011538 A1* | 1/2021 | Parry | G06F 3/0688 |
| 2022/0391321 A1* | 12/2022 | Sankaranarayanan | G11C 7/1039 |

* cited by examiner

*Primary Examiner* — Min Huang
(74) *Attorney, Agent, or Firm* — Lowenstein Sandler LLP

(57) ABSTRACT

A memory device includes a memory array comprising a plurality of planes and a plurality of independent plane driver circuits. The memory device further includes control logic to receive a request for one of the plurality of independent plane driver circuits to execute a high current event on a corresponding one of the plurality of planes in the memory device. The control logic is further to increment a counter tracking a number of high current events occurring in the memory device, and determine whether the number of high current events occurring in the memory device satisfies a threshold criterion. Responsive to determining that the number of high current events occurring in the memory device satisfies the threshold criterion, the control logic is to cause execution of the high current event to be delayed.

15 Claims, 7 Drawing Sheets

HEADROOM MANAGEMENT DURING PARALLEL PLANE ACCESS IN A MULTI-PLANE MEMORY DEVICE

RELATED APPLICATION

This application claims the benefit of U.S. Provisional Application Ser. No. 63/262,053, filed Oct. 4, 2021, which is hereby incorporated in its entirety herein by reference.

TECHNICAL FIELD

Embodiments of the disclosure relate generally to memory sub-systems, and more specifically, relate to headroom management during parallel plane access in a multi-plane memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
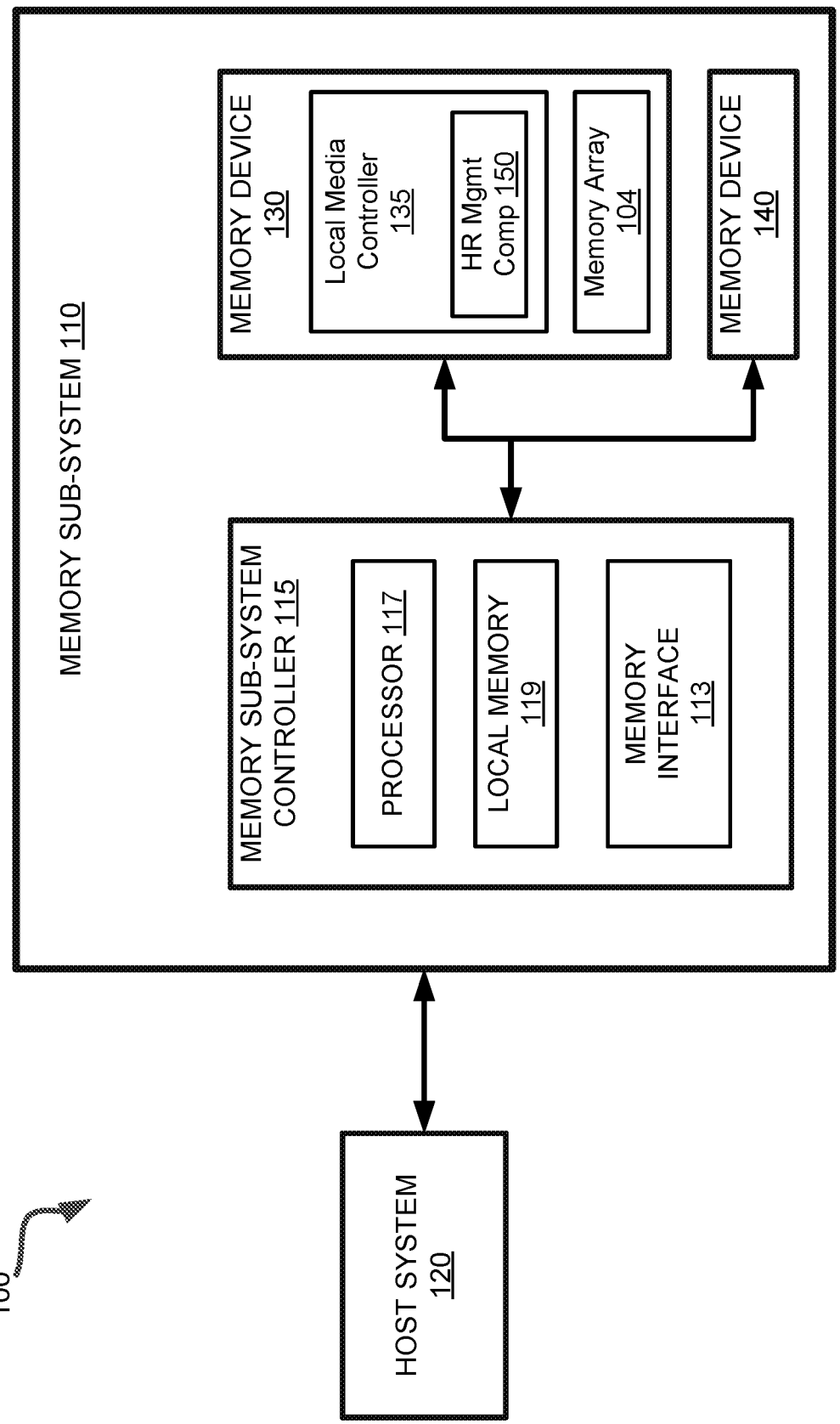
FIG. 1A illustrates an example computing system that includes a memory sub-system in accordance with some embodiments of the present disclosure.

Aspects of the present disclosure are directed to headroom management during parallel plane access in a multi-plane memory device in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Each independent plane driver circuit can be controlled by a corresponding processor (or processing thread).

In certain memory devices, each of the independent plane driver circuits can share a power supply system, including a current source and a series of power supply lines and buses. Certain operations performed by one or more of the independent plane driver circuits can draw a relatively high peak current. For example, during certain operations where data is read from the memory cells of a plane in the memory array, the data is temporarily stored in the latches of a page buffer associated with the plane. During this read process, a high level of current is drawn from the power supply system. Such an occurrence can be referred herein to as a "high current event." The power supply system in the memory device can only provide a certain amount of current at any one point in time. Thus, in order to ensure proper operation of the memory device, a local media controller on the media device can attempt to maintain a certain amount of current headroom (i.e., the difference between the maximum available current and the amount of current being requested at a given point in time). Since there can be multiple independent plane driver circuits and multiple processors independently operating on the different planes of a multi-plane memory device, it is possible for multiple high current events to occur on different memory planes concurrently (i.e., at least partially overlapping in time). Depending on the specifics of the power supply system, if there are enough high current events occurring concurrently, the peak current usage associated with those high current events can exceed the available current headroom in the memory device, leading to decreased performance or even failure of certain operations. In addition, in certain memory device, the independent plane driver circuits and processors operate independently without a mechanism for communicating with each other with respect to the respective operations being performed on each memory plane, thereby restricting any ability to schedule high current events at times when there is sufficient current headroom in the memory device. As the number of memory planes and corresponding independent plane driver circuits and processors in the memory device increases, so too does the likelihood of multiple high current events occurring concurrently.

Aspects of the present disclosure address the above and other deficiencies by providing headroom management during parallel plane access operations in a multi-plane memory device in a memory sub-system. By managing the occurrence of high current events associated with memory access operations being performed concurrently on separate planes of a multi-plane memory device, a local media controller can reduce the total peak current requested by the independent plane driver circuits during certain time periods when current headroom is limited. As a described herein, the multi-plane memory device can include multiple planes, each having an associated independent plane driver circuit and processor or processing thread configured to perform memory access operations concurrently. During the course of these memory access operations, a certain independent plane driver circuit can encounter a high current event (e.g., a period of time when the peak current requested is higher than normal). When such a high current event is encountered, the corresponding processor can send a request for permission to perform the high current event, or other notification, to a headroom management component on the memory device. The headroom management component can determine whether any other independent plane driver circuits are concurrently requesting permission to perform a high current event. In one embodiment, the headroom management component can maintain a threshold number of high current events that can be performed concurrently based on the current headroom in the memory device. In one embodiment, the threshold number is configurable (e.g., by controllable trim settings) to increase or decrease the number of high current events based on the specifics of the power supply system in the memory device. If a total number of requests to perform high current events at any one point in time satisfies a threshold criterion (e.g., meets or exceeds the threshold number), the headroom management component can deny or delay the request according to a defined arbitration scheme (e.g., a token ring counter) until adequate current headroom is available. Otherwise, the headroom management component can grant the request and the requesting processor can proceed with execution of the high current event on the corresponding memory plane.

Advantages of this approach include, but are not limited to, preventing the peak current requested concurrently by multiple independent plane driver circuits from exceeding an amount of available current in the memory device. This prevents the failure of memory access operations and can improve performance in the memory device. For example, an error rate associated with performing the memory access operations can be reduced without significantly impacting latency. Thus, the overall quality of service provided by the memory device is improved.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD), and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, the memory device 130 further includes headroom management component (HR Mgmt Comp) 150. In one embodiment, local media controller 135 of memory device 130 includes at least a portion of headroom management component 150. In such an embodiment, headroom management component 150 can be implemented using hardware or as firmware, stored on memory device 130, executed by the control logic (e.g., local media controller 135) to perform the operations related to headroom management during parallel plane access operations described herein.

In one embodiment, headroom management component 150 can manage high current events associated with memory access operations being performed concurrently on separate planes of memory device 130 in order to reduce the peak current levels during certain time periods. Memory device 130 can be a multi-plane memory device including multiple planes, each having an associated independent plane driver circuit configured to perform memory access operations concurrently (e.g., at least partially overlapping in time). During performance of these memory access operations, a certain independent plane driver circuit can encounter a high current event (e.g., an operation during which a peak current used by the independent plane driver circuit is to exceed a threshold amount of current). When such a high current event is encountered, headroom management component 150 can determine whether a total number of high current events currently occurring in the memory device satisfies a threshold criterion (e.g., meets or exceeds a threshold number). If not, headroom management component 150 can provide authorization for execution of the high current event. If so, however, headroom management component 150 can cause execution of the high current event to be delayed. Once the number of high current events currently occurring no longer satisfies the threshold criterion, headroom management component 150 can identify, based on an arbitration scheme, an additional high current event associated with one of the independent plane driver circuits to be executed. Further details with regards to the operations of headroom management component 150 are described below.

Figure 1B:
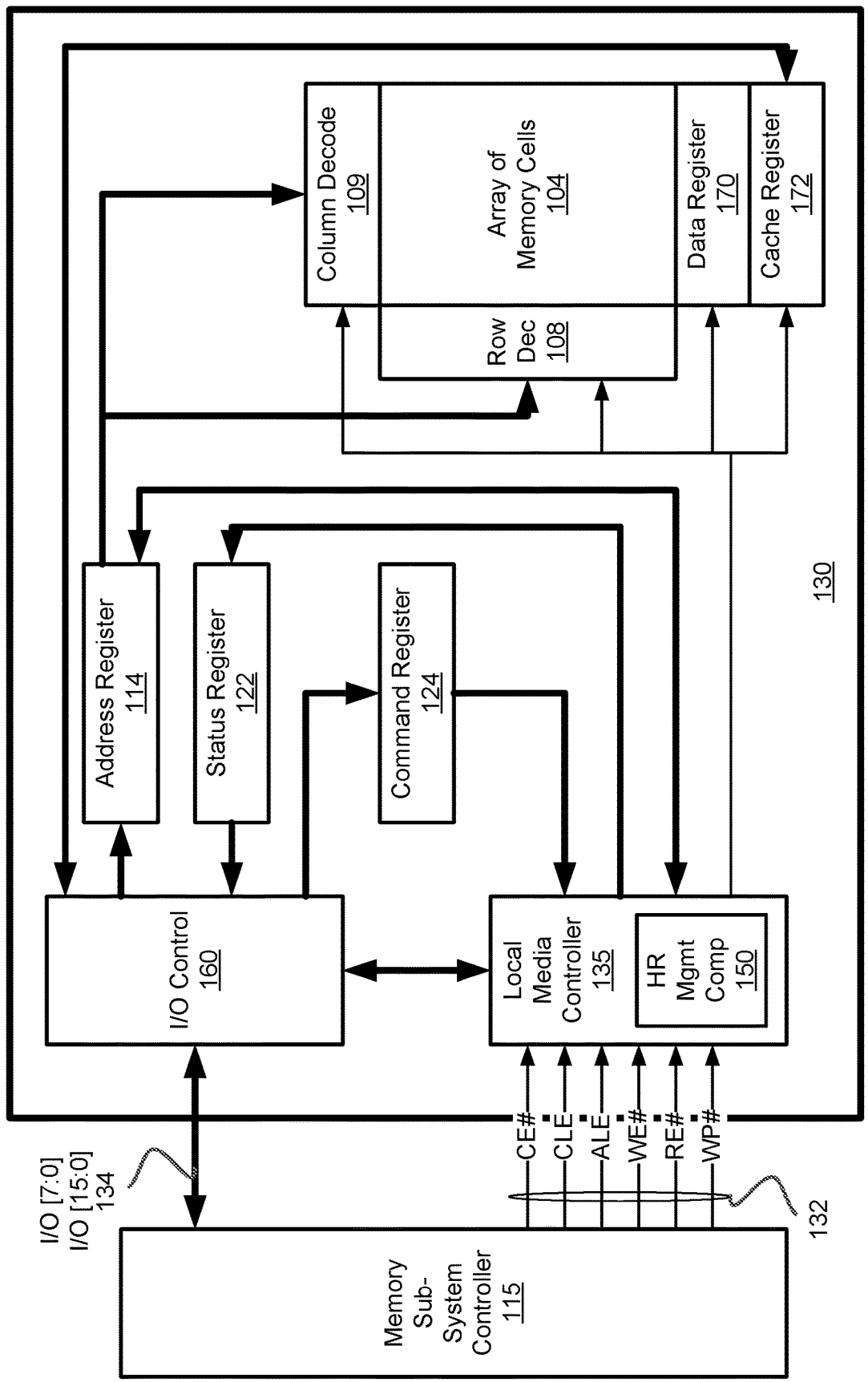
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 includes headroom management component 150 which can manage high current events associated with memory access operations being performed concurrently on separate planes of memory device 130 in order to reduce the peak current levels during certain time periods.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
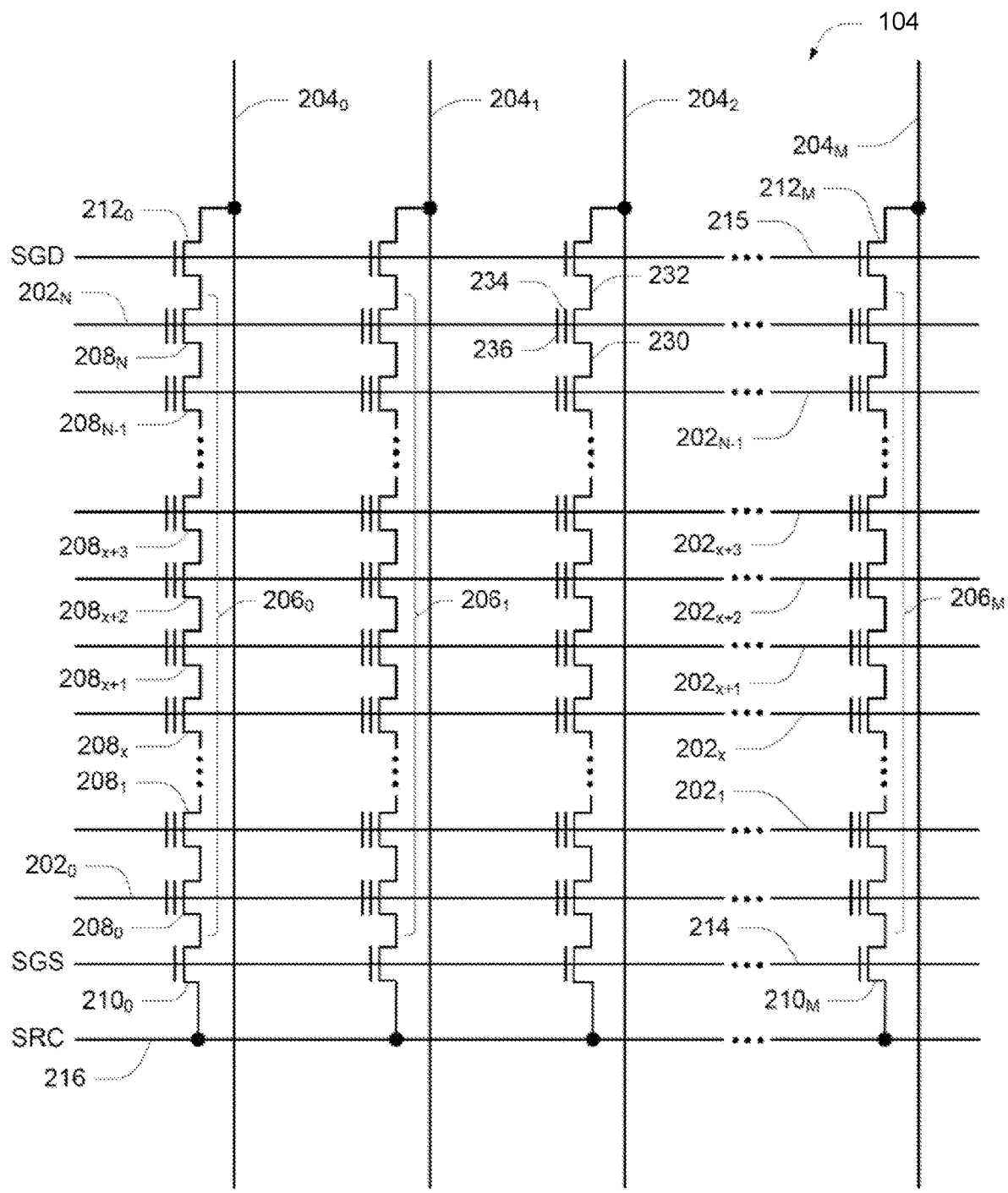
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
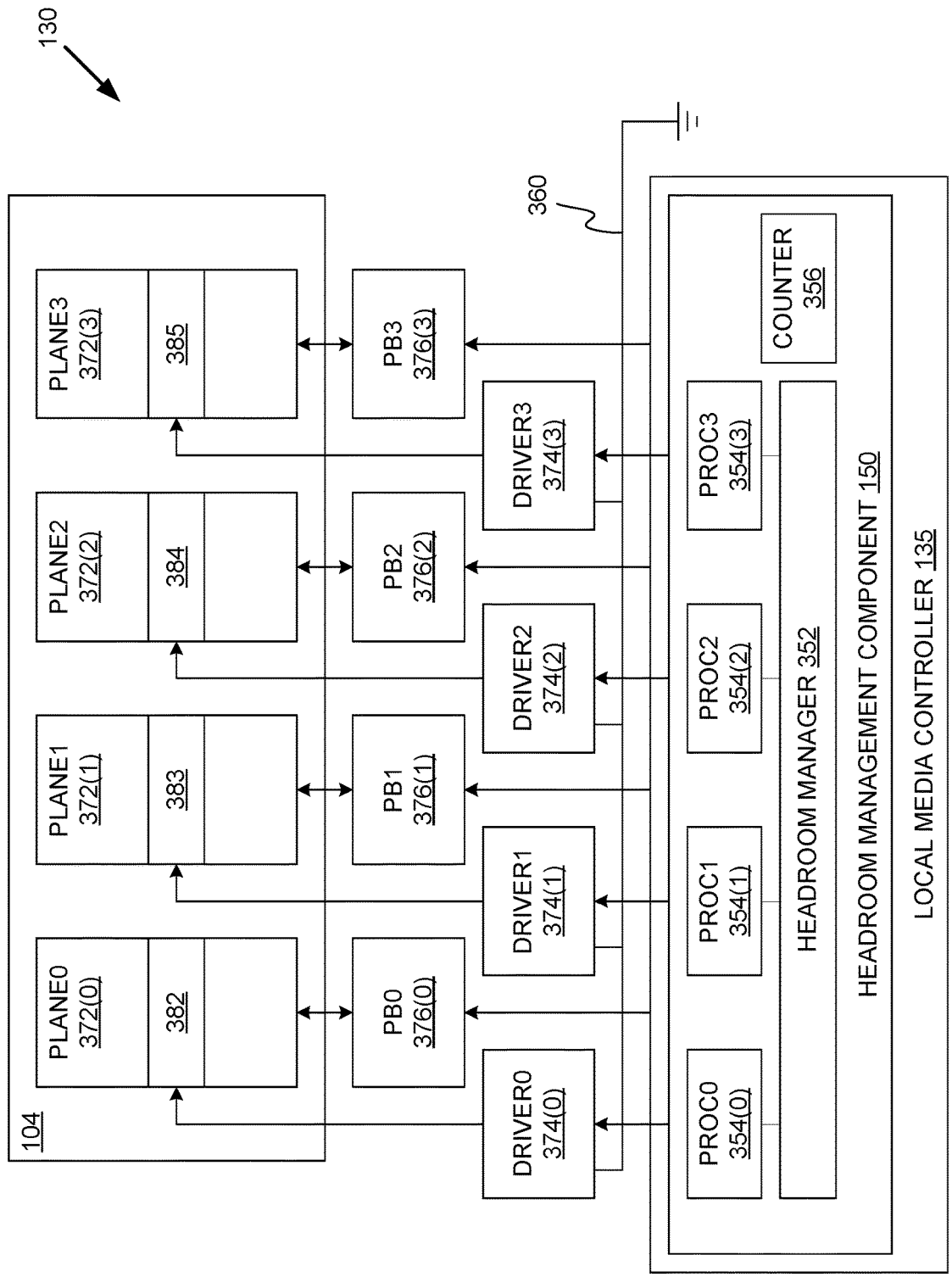
FIG. 3 is a block diagram illustrating a multi-plane memory device configured for headroom management during parallel plane accesses in accordance with some embodiments of the present disclosure.

FIG. 3 is a block diagram illustrating a multi-plane memory device 130 configured for independent parallel plane access in accordance with some embodiments of the present disclosure. The memory planes 372(0)-372(3) can each be divided into blocks of data, with a different relative block of data from two or more of the memory planes 372(0)-372(3) concurrently accessible during memory access operations. For example, during memory access operations, two or more of data block 382 of the memory plane 372(0), data block 383 of the memory plane 372(1), data block 384 of the memory plane 372(2), and data block 385 of the memory plane 372(3) can each be accessed concurrently.

The memory device 130 includes a memory array 104 divided into memory planes 372(0)-372(3) that each includes a respective number of memory cells. The multi-plane memory device 130 can further include local media controller 135, including a power control circuit and access control circuit for concurrently performing memory access operations for different memory planes 372(0)-372(3). The memory cells can be non-volatile memory cells, such as NAND flash cells, or can generally be any type of memory cells.

The memory planes 372(0)-372(3) can each be divided into blocks of data, with a different relative block of data from each of the memory planes 372(0)-372(3) concurrently accessible during memory access operations. For example, during memory access operations, data block 382 of the memory plane 372(0), data block 383 of the memory plane 372(1), data block 384 of the memory plane 372(2), and data block 385 of the memory plane 372(3) can each be accessed concurrently.

Each of the memory planes 372(0)-372(3) can be coupled to a respective page buffer 376(0)-376(3). Each page buffer 376(0)-376(3) can be configured to provide data to or receive data from the respective memory plane 372(0)-372(3). The page buffers 376(0)-376(3) can be controlled by local media controller 135. Data received from the respective memory plane 372(0)-372(3) can be latched at the page buffers 376(0)-376(3), respectively, and retrieved by local media controller 135, and provided to the memory sub-system controller 115 via the NVMe interface.

Each of the memory planes 372(0)-372(3) can be further coupled to a respective access driver circuit 374(0)-374(3), such as an access line driver circuit. The driver circuits 374(0)-374(3) can be configured to condition a page of a respective block of an associated memory plane 372(0)-372(3) for a memory access operation, such as programming data (i.e., writing data), reading data, or erasing data. Each of the driver circuits 374(0)-374(3) can be coupled to a respective global access lines associated with a respective memory plane 372(0)-372(3). Each of the global access lines can be selectively coupled to respective local access lines within a block of a plane during a memory access operation associated with a page within the block. The driver circuits 374(0)-374(3) can be controlled based on signals from local media controller 135. Each of the driver circuits 374(0)-374(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 374(0)-374(3) and page buffers 376(0)-376(3) to concurrently perform memory access operations associated with each of a group of memory command and address pairs (e.g., received from memory sub-system controller 115). For example, local media controller 135 can control the driver circuits 374(0)-374(3) and page buffer 376(0)-376(3) to perform the concurrent memory access operations. Local media controller 135 can include a power control circuit that serially configures two or more of the driver circuits 374(0)-374(3) for the concurrent memory access operations, and an access control circuit configured to control two or more of the page buffers 376(0)-376(3) to sense and latch data from the respective memory planes 372(0)-372(3), or program data to the respective memory planes 372(0)-372(3) to perform the concurrent memory access operations.

In operation, local media controller 135 can receive a group of memory command and address pairs via the NVMe bus, with each pair arriving in parallel or serially. In some examples, the group of memory command and address pairs can each be associated with different respective memory planes 372(0)-372(3) of the memory array 104. The local media controller 135 can be configured to perform concurrent memory access operations (e.g., read operations or program operations) for the different memory planes 372(0)-372(3) of the memory array 104 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 374(0)-374(3) for two or more memory planes 372(0)-372(3) associated with the group of memory command and address pairs. After the access line driver circuits 374(0)-374(3) have been configured, the access control circuit of local media controller 135 can concurrently control the page buffers 376(0)-376(3) to access the respective pages of each of the two or more memory planes 372(0)-372(3) associated with the group of memory command and address pairs, such as retrieving data or writing data, during the concurrent memory access operations. For example, the access control circuit can concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from local media controller 135, the driver circuits 374(0)-374(3) that are coupled to the memory planes 372(0)-372(3) associated with the group of memory command and address command pairs can select blocks of memory or memory cells from the associated memory plane 372(0)-372(3), for memory operations, such as read, program, and/or erase operations. The driver circuits 374(0)-374(3) can drive different respective global access lines associated with a respective memory plane 372(0)-372(3). As an example, the driver circuit 374(0) can drive a first voltage on a first global access line associated with the memory plane 372(0), the driver circuit 374(1) can drive a second voltage on a third global access line associated with the memory plane 372(1), the driver circuit 374(2) can drive a third voltage on a seventh global access line associated with the memory plane 372(2), etc., and other voltages can be driven on each of the remaining global access lines. In some examples, pass voltages can be provided on all access lines except an access line associated with a page of a memory plane 372(0)-372(3) to be accessed. The local media controller 135, the driver circuits 374(0)-374(3) can allow different respective pages, and the page buffers 376(0)-376(3) within different respective blocks of memory cells, to be accessed concurrently. For example, a first page of a first block of a first memory plane can be accessed concurrently with a second page of a second block of a second memory plane, regardless of page type.

The page buffers 376(0)-376(3) can provide data to or receive data from the local media controller 135 during the memory access operations responsive to signals from the local media controller 135 and the respective memory planes 372(0)-372(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the driver circuits 374(0)-374(3) can concurrently access different respective memory pages within different respective blocks of different memory planes when the different respective pages are of a different page type. In another embodiment, memory device 130 can include fewer driver circuits than there are planes. In such an embodiment, memory device 130 can further includes a plane selection circuit (e.g., a number of bi-directional multiplexer circuits) controlled by control signals received from local media controller 135. The plane selection circuit allows any of the driver circuits to be selectively coupled to any of the memory planes in memory device 130. In this manner, there is not a fixed association between any of the driver circuits and any of the planes.

In one embodiment, driver circuits 374(0)-374(3) share a common voltage supply line 360. Depending on the embodiment, common voltage supply line 360 can provide a positive voltage signal, a negative voltage signal, or a ground voltage signal to driver circuits 374(0)-374(3) to enable operation of certain components, such as nMOS transistors, within driver circuits 374(0)-374(3). While accessing different memory planes, the driver circuits 374(0)-374(3) can perform memory access operations that include high current events. High current events include operations or periods of time during which a peak current used by one or more the driver circuits 374(0)-374(3) is to exceed a threshold amount of current. For example, high current events can include sensing operations, data latching operations, operations were data is read from the memory cells of one of memory planes 372(0)-372(3) in the memory array 104 and temporarily stored in the latches of one of page buffers 376(0)-376(3), or other operations performed by the driver circuits 274(0)-274(3). Depending on how many of driver circuits 374(0)-374(3) are performing high current events on corresponding memory planes 372(0)-372(3) concurrently, the available current headroom in the memory device 130 can be exceeded.

In one embodiment, memory device 130 includes headroom management component 150 that can manage high current events associated with memory access operations being performed concurrently by driver circuits 274(0)-274(3) on planes 372(0)-372(3) in order to reduce the peak current levels during certain time periods. In one embodiment, headroom management component 150 includes headroom manager 352 and processors 354(0)-354(3). In one embodiment, each of processors 354(0)-354(3) corresponds to one of driver circuits 374(0)-374(3) and is responsible for monitoring and controlling operations thereof. For example, each of processors 354(0)-354(3) can monitor the status of operations being performed by the corresponding one of driver circuits 374(0)-374(3) and report that status to headroom manager 352. For example, when a high current event is scheduled to be executed by one of driver circuits 374(0)-374(3), a corresponding one of processors 354(0)-354(3) can issue a request to execute the high current event to headroom manager 352. In addition, each of processors 354(0)-354(3) can receive instructions from headroom manager 352, such as whether to permit, suspend, or resume high current events during the operations being performed by the corresponding one of driver circuits 374(0)-374(3). High current manager 352 can manage the status of driver circuits 374(0)-374(3), identify high current events, determine whether to permit high current events (e.g., based on a value of counter 356 which is incremented when a high current event is requested and decremented when a high current event has completed), and permit high current events based on a defined arbitration scheme, as described herein.

Figure 4:
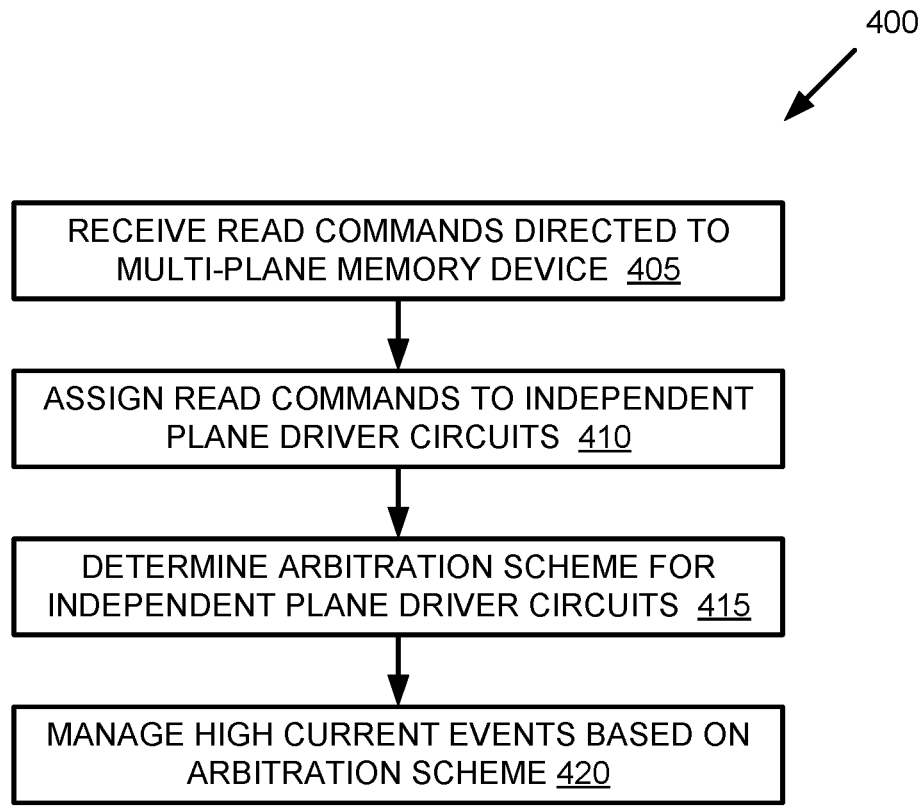
FIG. 4 is a flow diagram of an example method of headroom management during parallel plane accesses in a multi-plane memory device in a memory sub-system in accordance with some embodiments of the present disclosure.

FIG. 4 is a flow diagram of an example method of headroom management during parallel plane accesses in a multi-plane memory device in a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by headroom management component 150 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, memory access commands are received. For example, processing logic (e.g., local media controller 135) can receive a series of memory access command directed to a memory device, such as memory device 130. In one embodiment, the memory access commands are read commands, which can be received from a controller, such as memory sub-system controller 115, some other component of memory sub-system 110, or from an external component, such as host system 120. In one embodiment, the read commands specify at least one of a logical or physical address associated with data to be read from memory device 130.

At operation 410, a corresponding plane of a memory device is identified for each memory access command. For example, the processing logic can identify a corresponding one of a number of planes, such as memory planes 372(0)-372(3), of a memory array 104 of the memory device to which each read command is directed. In one embodiment, the processing logic identifies the plane of memory planes 372(0)-372(3) storing a block of data corresponding to the logical or physical address included in each received read command. For example, local media controller 135 can maintain a mapping of memory addresses to each of the memory planes 372(0)-372(3). Upon identifying the corresponding planes, the processing logic can assign the read commands in independent plane driver circuits 374(0)-374(3) associated with the memory planes 372(0)-372(3). In one embodiment, each driver circuit is associated with one of memory planes 372(0)-372(3). Accordingly, the processing logic can assign each read command to one of driver circuits 374(0)-374(3) associated with the one of memory planes 372(0)-372(3) to which the read command is directed. In one embodiment, to assign the read command to one of driver circuits 374(0)-374(3), the processing logic can add an indication of the read command to a queue (e.g., a buffer, FIFO, etc.) of commands associated with the driver circuit and to be processed by an associated one of processors 354(0)-354(3). The associated one of processors 354(0)-354(3) can subsequently send read commands from the associated queue to the driver circuit which can perform the memory access operation on a block of the corresponding memory plane.

At operation 415, an arbitration scheme is determined. For example, the processing logic can determine an arbitration scheme for handling conflicts between independent plane driver circuits 274(0)-274(3). In one embodiment, headroom management component 150 can implement a token ring counter that periodically circulates a token among independent plane driver circuits 374(0)-374(3). After a certain period of time, the token rotates from one driver circuits to another. A holder of the token at a time a request to execute a high current event is made is granted priority over the other driver circuits 374(0)-374(3). In another embodiment, the arbitration scheme is based on an order in which commands corresponding to the memory access operations were received at memory device 130. For example, if a certain command directed to a first plane 372(0) and assigned to driver circuit 274(0) is received before another command directed to a second plane 372(1) and assigned to driver circuit 274(1), headroom management component 150 can assign a higher priority to driver circuit 274(0) than driver circuit 274(1). In one embodiment, headroom management component 150 can maintain a ordered list or other data structure of each command indicating the order in which they were received and the one of driver circuits 274(0)-274(3) to which they are assuaged. Thus, to determine the respective priorities, headroom management component 150 can compare the position of any two or more read commands and/or driver circuits in the list to determine an order in which those read commands were received.

At operation 420, events occurring during the performance of memory access operations are managed. For example, the processing logic can manage high current events corresponding to the read commands based on the arbitration scheme. As described herein, headroom management component 150 can monitor a number of high current events currently occurring in memory device 130 (e.g., by incrementing and decrementing a counter, such as counter 356, respectively). If the value of the counter satisfies a threshold criterion (e.g., meets or exceeds a threshold value) headroom management component 150 can cause execution of a newly requested high current event to be delayed. For example, headroom management component 150 can not provide authorization to perform the newly requested high current event, which can cause the requesting processor and independent plane driver circuit to wait to perform the high current event. In one embodiment, once one or more high current events have ended and the number of high current events occurring in the memory device 130 no longer satisfies the threshold criterion (e.g., is less than the threshold value), headroom management component 150 can identify, based on an arbitration scheme, an additional high current event associated with one of the plurality of independent plane driver circuits to be executed. For example, the additional high current event can include a high current event requested by a current holder of the rotating token, a pending high current event for which a request was least recently received, or some other high current event having a highest priority.

Figure 5:
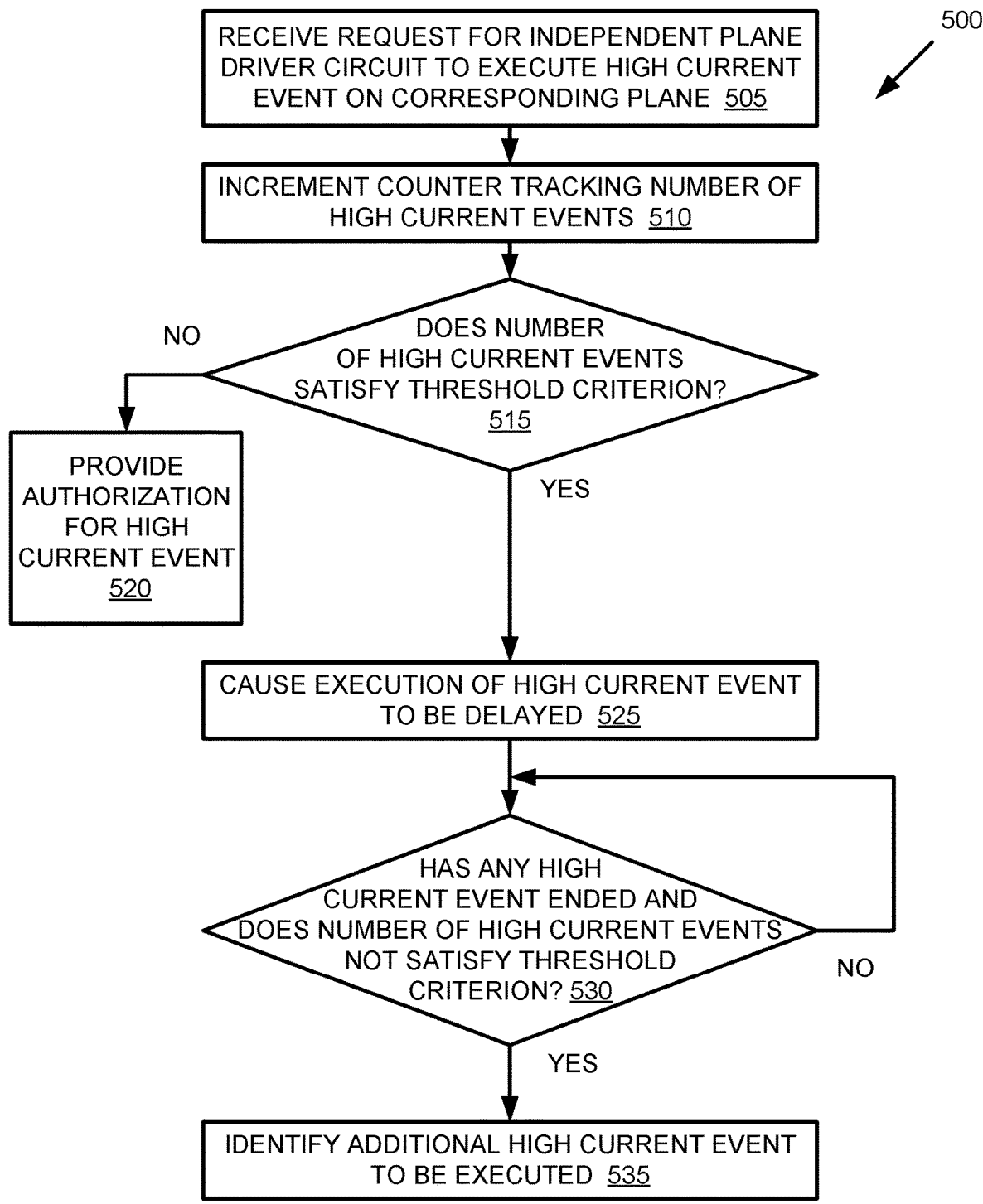
FIG. 5 is a flow diagram of an example method of headroom management during parallel plane accesses in a multi-plane memory device in a memory sub-system in accordance with some embodiments of the present disclosure.

FIG. 5 is a flow diagram of an example method of headroom management during parallel plane accesses in a multi-plane memory device in a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by headroom management component 150 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a request is received. For example, the processing logic (e.g., headroom management component 150) can track the status of independent plane driver circuits 374(0)-374(3). In one embodiment, tracking the status can include monitoring the performance of memory access operations, such as read operations, being performed by independent plane driver circuits 374(0)-374(3) on memory planes 372(0)-372(3) of memory device 130. In one embodiment, headroom management component 150 maintains an indication of the status in some local memory to be referenced during the headroom management operations. In one embodiment, the processing logic can detect the occurrence of a high noise event associated with a first independent plane driver circuit, such as driver circuit 374(0), corresponding to a first plane, such as memory plane 372(0), of multiple memory planes 372(0)-372(3) of memory device 130. For example, headroom manager 352 of headroom management component 150 can receive a request for driver circuit 374(0) to execute a high current event on corresponding memory plane 372(0). In one embodiment, the request is received from a processor, such as processor 354(0) corresponding to driver circuit 374(0). The high current event can include, for example, an operation during which a peak current used by the driver circuit 374(0) is to exceed a threshold amount of current. In one embodiment, the threshold amount of current is configurable and can be tailored to the specifications of the particular memory device 130.

At operation 510, a number of events is tracked. For example, the processing logic can increment a counter, such as counter 356, tracking a number of high current events occurring in the memory device 130. In one embodiment, the number of high current events occurring in the memory device 130, as represented by the value of counter 356, can be associated with any of the driver circuits 374(0)-374(3). For example, counter 356 can start at an initial value (e.g., zero) can be incremented by a set amount (e.g., one) each time a request to execute a high current event on any of memory planes 372(0)-372(3) of memory device 130 is received. Similarly, once any of the high current events end (e.g., terminate or otherwise finish execution), the counter 356 can be decremented by the set amount (e.g. one).

At operation 515, a determination is made. For example, the processing logic can determine whether the number of high current events occurring in the memory device 130 satisfies a threshold criterion. In one embodiment, headroom management component 150 can determine that the number of high current events occurring in the memory device 130 satisfies the threshold criterion if the number of high current events occurring in the memory device 130, as represented by the value of counter 356, is greater than or equal to a threshold number of events. In one embodiment, the threshold number of events is configurable and can be tailored to the specifications of the particular memory device 130.

If the number of high current events occurring in the memory device 130 does not satisfy the threshold criterion, at operation 520, authorization is provided. For example, the processing logic can provide authorization for execution of a high current event. In one embodiment, headroom manager 352 can send a signal representing the authorization to processor 354(0), or any other processor which originally sent the request to execute the high current event. Since the number of high current events occurring in memory device 130 is less than the threshold number of events, there is adequate current headroom in the memory device 130 to support execution of the requested high current event without negative performance impacts.

If the number of high current events occurring in the memory device 130 satisfies the threshold criterion, at operation 525, execution is delayed. For example, the processing logic can cause execution of the requested high current event to be delayed. In one embodiment, headroom manager 352 does not send a signal representing an authorization to processor 354(0), or any other processor which originally sent the request to execute the high current event. Since the number of high current events occurring in memory device 130 is greater than or equal to the threshold number of events, there is insufficient current headroom in the memory device 130 to support execution of the requested high current event and negative performance impacts could occur.

At operation 530, a determination is made. For example, the processing logic can determine whether one or more high current events occurring in memory device 130 have ended, and whether the number of high current events occurring in the memory device 130 no longer satisfies the threshold criterion. In on embodiment, headroom management component 150 can receive a notification (e.g., from one of processors 354(0)-354(3)) that a high current event occurring on a corresponding one of memory planes 372 (0)-372(3) has ended. In another embodiment, headroom management component 150 determines that a high current event has ended after a defined period of time has passed since permission to execute the high current event was granted. In either case, headroom management component 150 can decrement counter 356 by a set amount (e.g., one) in response to determining that a high current event has ended. In response, headroom management component 150 can determine whether the number of high current events occurring in the memory device 130, as indicated by the decremented value of counter 356, no longer satisfies the threshold criterion (e.g., is less than the threshold number of events).

At operation 535, an event is identified. For example, the processing logic can identify, based on an arbitration scheme, an additional high current event associated with one of the plurality of independent plane driver circuits 374(0)-374(3) to be executed. For example, the additional high current event can include a high current event requested by a current holder of the rotating token, a pending high current event for which a request was least recently received, or some other high current event having a highest priority. In one embodiment, headroom management component 150 can provide authorization for execution of the additional high current event. In one embodiment, the operations 505-535 can be repeated to manage processing of additional high current events in memory device 130.

Figure 6:
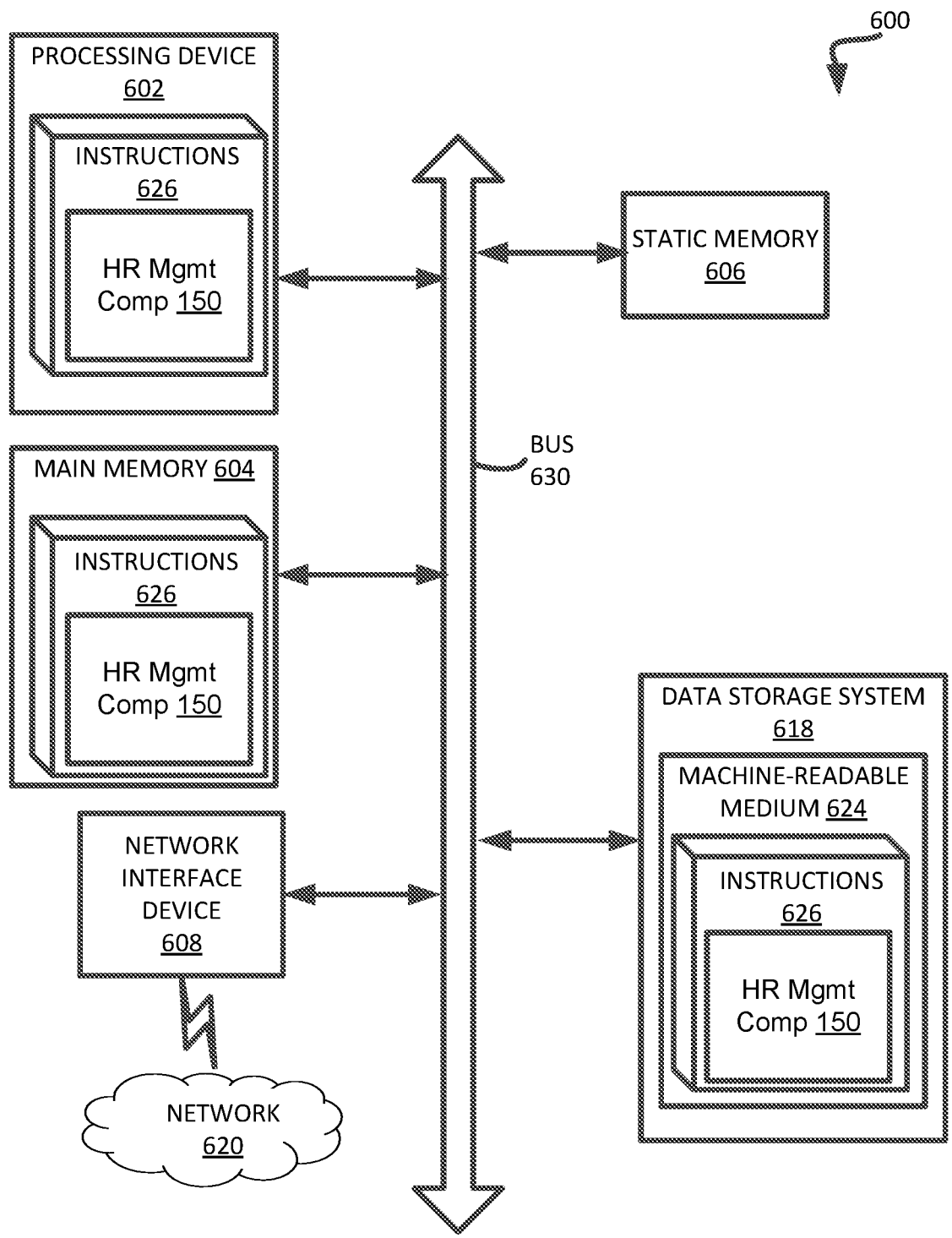
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to headroom management component 150 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium, such as a non-transitory computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to headroom management component 150 of FIG. 1A). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a plurality of planes;
a plurality of independent plane driver circuits operatively coupled with the plurality of planes; and
control logic, operatively coupled with the memory plurality of independent plane driver circuits, to perform operations comprising:
receiving a request for one of the plurality of independent plane driver circuits to execute a high current event on a corresponding one of the plurality of planes;
incrementing a counter tracking a number of high current events occurring in the memory device;
determining whether the number of high current events occurring in the memory device is greater than or equal to a threshold number of events, wherein the threshold number of events is based on a number of independent plane driver circuits in the plurality of independent plane driver circuits; and
responsive to determining that the number of high current events occurring in the memory device is greater than or equal to the threshold number of events, causing execution of the high current event to be delayed.

2. The memory device of claim 1, wherein the high current event comprises an operation during which a peak current used by the one of the plurality of independent plane driver circuits is to exceed a threshold amount of current.

3. The memory device of claim 1, wherein the number of high current events occurring in the memory device is associated with any of the plurality of independent plane driver circuits.

4. The memory device of claim 1, wherein the control logic is to perform operations further comprising:
determining that one or more high current events have ended and that the number of high current events occurring in the memory device is no longer greater than or equal to the threshold number of events; and
identifying, based on an arbitration scheme, an additional high current event associated with one of the plurality of independent plane driver circuits to be executed.

5. The memory device of claim 4, wherein the arbitration scheme comprises a token ring counter that periodically circulates among the plurality of independent plane driver circuits.

6. The memory device of claim 1, wherein the control logic is to perform operations further comprising:
responsive to determining that the number of high current events occurring in the memory device is not greater than or equal to the threshold number of events, providing authorization for execution of the high current event.

7. A method comprising:
receiving a request for one of a plurality of independent plane driver circuits in a memory device to execute a high current event on a corresponding one of a plurality of planes in the memory device;
incrementing a counter tracking a number of high current events occurring in the memory device;
determining whether the number of high current events occurring in the memory device is greater than or equal to a threshold number of events, wherein the threshold number of events is based on a number of independent plane driver circuits in the plurality of independent plane driver circuits; and
responsive to determining that the number of high current events occurring in the memory device is greater than or equal to the threshold number of events, causing execution of the high current event to be delayed.

8. The method of claim 7, wherein the high current event comprises an operation during which a peak current used by the one of the plurality of independent plane driver circuits is to exceed a threshold amount of current.

9. The method of claim 7, wherein the number of high current events occurring in the memory device is associated with any of the plurality of independent plane driver circuits.

10. The method of claim 7, further comprising:
determining that one or more high current events have ended and that the number of high current events occurring in the memory device is no longer greater than or equal to the threshold number of events; and
identifying, based on an arbitration scheme, an additional high current event associated with one of the plurality of independent plane driver circuits to be executed.

11. The method of claim 10, wherein the arbitration scheme comprises a token ring counter that periodically circulates among the plurality of independent plane driver circuits.

12. The method of claim 7, further comprising:
responsive to determining that the number of high current events occurring in the memory device is not greater than or equal to the threshold number of events, providing authorization for execution of the high current event.

13. A memory device comprising:
a memory array comprising a plurality of planes;
a plurality of independent plane driver circuits operatively coupled with the plurality of planes; and
control logic, operatively coupled with the memory plurality of independent plane driver circuits, to perform operations comprising:
receiving a plurality of read commands directed to the memory device;
assigning the plurality of read commands to the plurality of independent plane driver circuits coupled with the plurality of planes;
determining an arbitration scheme for the plurality of independent plane driver circuits, wherein the arbitration scheme comprises a token ring counter that periodically circulates among the plurality of independent plane driver circuits; and
managing high current events corresponding to the plurality of read commands based on the arbitration scheme for the plurality of independent plane driver circuits.

14. The memory device of claim 13, wherein managing the high current events comprises:
determining whether a number of high current events occurring in the memory device satisfies a threshold criterion; and responsive to determining that the number of high current events occurring in the memory device satisfies the threshold criterion, causing execution at least one high current event to be delayed.

15. The memory device of claim 13, wherein managing the high current events comprises:
determining whether a number of high current events occurring in the memory device satisfies a threshold criterion; and
responsive to determining that the number of high current events occurring in the memory device does not satisfy the threshold criterion, providing authorization for execution of the high current events.

* * * * *